United States Patent
Tseng

Patent Number: 5,766,998
Date of Patent: Jun. 16, 1998

[54] METHOD FOR FABRICATING NARROW CHANNEL FIELD EFFECT TRANSISTORS HAVING TITANIUM SHALLOW JUNCTIONS

[75] Inventor: Horng-Huei Tseng, Hsinchu, Taiwan

[73] Assignee: Vanguard International Semiconductor Corporation, Hsin-Chu, Taiwan

[21] Appl. No.: 775,056

[22] Filed: Dec. 27, 1996

[51] Int. Cl.⁶ ............................................. H01L 21/336
[52] U.S. Cl. ........................... 438/291; 438/305; 438/564
[58] Field of Search ................................ 438/289, 291, 438/305, 306, 558, 559, 564

[56] References Cited

U.S. PATENT DOCUMENTS

| | | | |
|---|---|---|---|
| 5,175,118 | 12/1992 | Yoneda | 438/564 |
| 5,196,357 | 3/1993 | Boardman et al. | 438/305 |
| 5,268,317 | 12/1993 | Schwalke et al. | 438/306 |
| 5,545,579 | 8/1996 | Liang et al. | 438/291 |

*Primary Examiner*—Chandra Chaudhari
*Attorney, Agent, or Firm*—George O. Saile; Stephen B. Ackerman

[57] ABSTRACT

An improved reverse self-aligned FET having subquarter-micrometer channel lengths, shallow junction depths, and silicide source/drain contacts was achieved. The method for fabricating the FET includes forming a titanium layer, an N⁺ doped first polysilicon layer, and a silicon nitride layer over the device areas. A photoresist mask having first openings with minimal feature size is formed over the device areas where gate electrodes are desired. Non-volatile polymer sidewall spacers are formed on the side-walls of the first openings to extend the resolution limit of the photoresist. The sidewalls and photoresist are used as a mask to etch the silicon nitride layer, the first polysilicon layer, and the titanium layer to the substrate to form second openings (FET channel openings) where the gate electrodes are to be formed. A gate oxide is grown on the substrate in the channel openings, and a threshold-voltage implant and an anti-punchthrough implant are carried out in the channel openings, and then an N⁺ doped second polysilicon layer is patterned to form the gate electrodes over the gate oxide. The reverse self-aligned FET is then completed by carrying out subsequent thermal cycles to out-diffuse the N⁺ dopant from the first polysilicon layer through the titanium layer to form shallow source/drain junctions aligned to the gate electrodes.

28 Claims, 4 Drawing Sheets

METHOD FOR FABRICATING NARROW CHANNEL FIELD EFFECT TRANSISTORS HAVING TITANIUM SHALLOW JUNCTIONS

BACKGROUND OF THE INVENTION

(1) FIELD OF THE INVENTION

The present invention relates to the fabrication of integrated circuit devices on semiconductor substrates, and more particularly relates to a method for fabricating field effect transistors having channel lengths exceeding the photoresist resolution limit and having titanium silicide source/drain contacts with shallow junctions.

(2) DESCRIPTION OF THE PRIOR ART

In recent years advances in the semiconductor process technologies have significantly decreased the device feature size and thereby increased the circuit density and performance on integrated circuit chips. The current Ultra Large Scale Integration (ULSI) uses predominantly Field Effect Transistors (FETs) having silicon gate electrodes with self-aligned source/drain contact areas. These FETs provide very high packing densities, low power consumption, and high yields.

Conventional FETs are fabricated typically by growing a thin gate oxide on a single crystal semiconductor substrate, and then forming polysilicon gate electrodes. Self-aligned source/drain contacts are made in the substrate adjacent to the sides of the gate electrodes. The channel length of the FET is defined as the distance under the gate electrode between the source/drain contacts Semiconductor technology advances, such as high resolution photolithographic techniques and anisotropic plasma etching, have reduced the minimum feature sizes on devices to less than a quarter-micrometer (0.25 um). If further increases in circuit density and device performance are to continue, then device minimum feature sizes should be further reduced.

As this downscaling continues and as the channel length is further reduced, a number of undesirable electrical characteristics known as short channel effects (SCE) can occur on the FET device. These short channel effects become more apparent as the FET channel length is further scaled down. This result is due in part to the fact that the band gap and built-in potential at junctions are a constant of the semiconductor crystalline material and non-scalable.

The undesirable short channel effects result from high field distribution in the channel area when the integrated circuit is powered up. For example, hot electrons ejected from the drain can acquire sufficient energy to be injected into the gate oxide. This results in charge buildup in the gate oxide that can cause threshold voltage shifts. This hot electron effect unfortunately can degrade device performance. Another adverse effect is the threshold voltage lowering, commonly referred to as threshold voltage roll-off. This decrease in the threshold voltage ($V_{th}$) with reduced channel length can occur when the source/drain junction depth is comparable to the channel length.

One method practiced in the semiconductor industry is to fabricate FET structures with double diffused drains (DDD) or lightly doped drains (LDDs) to minimize the short channel effects. These DDD or LDD FET structures, having low dopant concentration in the drain areas adjacent to the gate electrodes, change the profile of the electric field in the drain areas adjacent to the FET channel, thereby minimizing or eliminating the hot electron and roll-off effects. These adverse effects can be minimized by also forming shallower source/drain areas.

Another problem with conventional FETs having gate electrodes patterned by current photolithographic techniques is that it is difficult to fabricate repeatably and reliably very narrow (for example,<0.25 um) gate electrode structures.

One method for forming shallow junctions in FETs is described U. Schwalke et al., U.S. Pat. No. 5,268,317. The method involves forming a conventional FET having a metal silicide on the source/drain contacts in which is implanted a dopant, which is then out-diffused into the substrate to form shallow source/drain contacts. However, Schwalke et al. do not describe a method for extending the lithographic resolution to make very narrow gate electrodes for FETs having sub-quarter-micrometer channel lengths.

Therefore, there is still a strong need in the semiconductor industry for making FETs having gate electrode widths that exceed the resolution of the photolithography, while concurrently forming source/drain areas with shallow junction depths.

SUMMARY OF THE INVENTION

It is therefore a principal object of this invention to describe a method for fabricating reverse self-aligned field effect transistor structures having FET gate electrodes that exceed the photolithographic resolution limit by using polymer sidewall spacers.

It is another object of this invention to provide reverse self-aligned FET structures having source/drain areas with shallow junction depths and titanium silicide contacts to the source/drain areas thereby forming low electrical contact resistance.

It is still another object of the invention to provide these FET structures having threshold voltage and anti-punchthrough implantations to further minimize short channel effects.

In accordance with the objects of this embodiment, a method for fabricating improved reverse self-aligned field effect transistors (FETs) with titanium silicide contacts on shallow diffused source/drain junctions and the FETs having sub-quarter-micrometer channel lengths is described.

The method for making these FETs starts by providing a single crystal semiconductor substrate doped with a first conductive type dopant, such as a P-type dopant (boron), and a field oxide (FOX) that surrounds and electrically isolates device areas on and in which the FETs are built. A metal layer, such as titanium (Ti), is deposited over the device areas and the FOX areas on the substrate. A first polysilicon layer having a second conductive type dopant, comprising an N-type dopant such as phosphorus (P), is deposited on the titanium metal layer. Next, a first insulating layer, such as silicon nitride ($Si_3N_4$) is deposited on the first polysilicon layer. A photoresist masking layer is spin coated over the first insulating layer and patterned to form first openings having essentially vertical sidewalls. These openings are over and within the device areas where N-channel FET gate electrodes are required. By reversing the first and second conductive type dopants, P-channel FETs can also be fabricated. The minimum opening size in the photoresist can be the current resolution limit of the photoresist (e.g., 0.35 um). Now, in accordance with the objects of this invention, non-volatile polymer sidewall spacers are formed on the sidewalls in the first openings of the photoresist. For example, the polymer sidewall spacers can be formed in a plasma etcher using an etchant gas mixture composed of argon (Ar), trifluoromethane ($CHF_3$), carbon tetrafluoride ($CF_4$), and nitrogen ($N_2$). By this polymer deposition process, the first insulating layer ($Si_3N_4$) is exposed in the first openings between the sidewalls where the FET gate electrodes are required. A key feature is that the first openings with the sidewall spacers reduce the opening size beyond the current lithographic limits of the photoresist. For example, if the first openings are 0.35 micrometer (um) wide, and the sidewall spacers are 0.1 um, then the openings are then reduced to 0.15 um, which exceeds the lithography limit. The photoresist and the sidewall spacers are now used as an etch mask to anisotropically etch second openings through the first insulating layer, the first polysilicon layer, and the titanium metal layer down to the surface of the P doped substrate. These second openings also have essentially vertical sidewalls in which the FET gate electrodes will be formed. The polymer sidewall spacers and the photoresist are removed by plasma ashing in an oxygen ambient. A relatively thin conformal second insulating layer, such as low pressure chemical vapor deposited (LPCVD) silicon oxide ($SiO_2$) is deposited, and then anisotropically etched back using, for example, reactive ion etching. This results in sidewall spacers being formed in the second openings on the sidewalls of the first polysilicon layer, and concurrently exposes the substrate surface in the second openings. A relatively thin gate oxide is grown on the exposed substrate in the second openings where the FET gate electrodes will be formed. An implant of the first conductive type dopant is carried out through the gate oxide and into the underlying substrate to provide a self-aligned anti-punchthrough implant to eliminate punchthrough from drain to source. For example, a boron implant can be used for the N-channel FET. The gate electrodes for the reverse self-aligned FET are formed by depositing a second polysilicon layer doped with the second conductive type dopant, for example, an N-type dopant such as phosphorus (P) or arsenic (As), and then patterned by photolithographic techniques and plasma etching, leaving portions of the polysilicon over the second openings. During subsequent thermal cycling (annealing), the $N^+$ doped source/drain out-diffuses the N dopant from the first polysilicon layer through the titanium layer into the substrate forming the very shallow $N^+$ source/drain regions adjacent to the gate electrodes. Concurrently, the Ti layer reacts with the silicon to form low electrical resistance titanium silicide contacts to the source/drain regions.

BRIEF DESCRIPTION OF THE DRAWINGS

The objects and other advantages of the invention will become more apparent in the preferred embodiment when read in conjunction with the following drawings.

DESCRIPTION OF THE PREFERRED EMBODIMENT

Referring now to FIGS. 1 through 8, the preferred embodiment is shown for making this new reverse self-aligned field effect transistor (FET) having narrow channel lengths and source/drain regions with shallow junctions. The process in described for making N-channel FETs, but it should be well understood by those skilled in the art that P-channel FETs can also be fabricated by reversing the conductive polarity, that is by reversing the dopant types and adjusting appropriately the dopant concentrations. It should also be understood that by including both N- and P-type well regions in the substrate and by including additional masking and implant steps, that both N- and P-channel FETs can be fabricated simultaneously on the same substrate and that Complementary MOS (CMOS) circuits can be formed therefrom.

Figure 1:
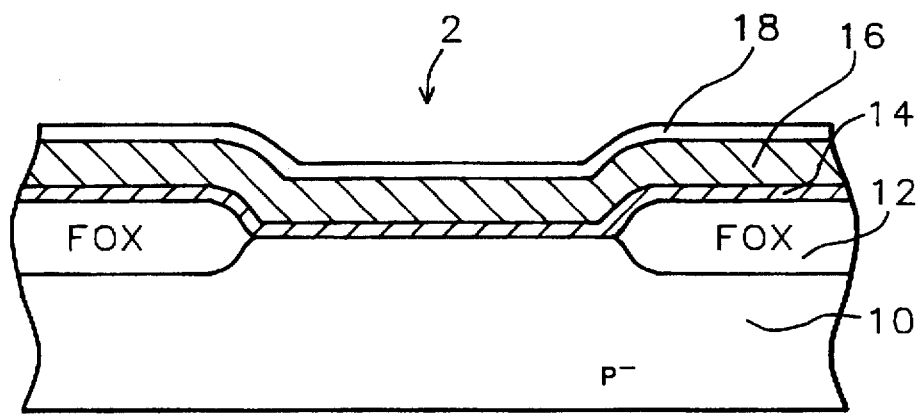
FIGS. 1 through 8 show schematically in cross-sectional representation the preferred embodiment of the invention for fabricating reverse self-aligned field effect transistors using polymer sidewall spacers to extend the lithography resolution limit, and for forming shallow source/drain junctions with low electrical resistance silicide contacts.

Referring first to FIG. 1, the process starts by forming a Field OXide (FOX) region 12 on a substrate 10. The FOX separates and electrically isolates device areas where the reverse self-aligned FETs are to be built. FIG. 1 shows a cross-sectional view of a portion of this substrate 10 depicting one of the device areas 2 surrounded by a FOX structure 12. For the N-channel FET, the preferred substrate 10 is typically composed of a P-type doped single crystal silicon with a<100> crystallographic orientation. Alternatively, an N-type doped substrate can be used for making P-channel FETs but, for simplicity of presentation, only the N-channel FET is described in this embodiment. The method commonly practiced in the semiconductor industry for forming the field oxide is referred to as the LOCal Oxidation of Silicon (LOCOS), which consists of using a thin thermal oxide (pad oxide) and a silicon nitride layer on the substrate surface as an oxidation-resistant mask. These layers are not shown in FIG. 1. The desired field oxide regions are etched open in the oxide/nitride layer using conventional photolithographic techniques, and then the substrate is subjected to an oxidizing ambient to thermally grow the field oxide 12. A typical thickness for the field oxide is between about 4000 and 6000 Angstroms and can be grown, for example, by steam oxidation.

After removing the silicon nitride and pad oxide layers in a wet etch, the semiconductor devices are then fabricated on the silicon surface in the non-oxidized device areas 2. Typically the silicon nitride is removed in a solution of heated phosphoric acid ($H_3PO_4$), and the thin pad oxide is removed in a dilute hydrofluoric acid solution ($HF/H_2O$). These reverse self-aligned FETs having narrow channel lengths and shallow source/drain junctions are formed in the device areas, such as area 2 in FIG. 1, by the sequence of processing steps detailed below.

Still referring to FIG. 1, a metal layer 14, such as titanium (Ti), is deposited over the device areas 2 and the FOX areas 12 on the silicon substrate 10. For example, the Ti metal can be deposited by physical deposition, such as by sputter deposition. Alternatively the titanium can be deposited by chemical vapor deposition (CVD) to provide improved edge coverage using a reactant gas such as titanium tetrachloride ($TiCl_4$). The preferred thickness of the Ti layer is between about 100 and 500 Angstroms. Next, a first polysilicon layer 16 is deposited over the metal layer 14. Layer 16 is preferably deposited at a relatively low temperature. For example, polysilicon layer 16 can be deposited by conventional methods, such as by low pressure chemical vapor deposition (LPCVD) using, for example, a reactant gas such as silane ($SiH_4$) and at a deposition temperature of about 570° C. or lower. The thickness of layer 16 is preferably in a range of between about 1000 and 3000 Angstroms. Layer 16 is then doped with a second conductive type dopant, comprising an N-type dopant such as arsenic (As) or phosphorus (P), by ion implantation. Alternatively, layer 16 can be doped in situ during deposition by adding phosphine ($PH_3$) or arsine ($AsH_3$) to the $SiH_4$ gas. The preferred dopant concentration in layer 16 is between about 1.0 E 20 and 1.0 E 21 atoms/$cm^3$. Polysilicon layer 16 will eventually form part of the source/drain contacts for the FETs from which the N-type dopant will be out-diffused through the Ti layer 14 into the substrate 10 to form the shallow source/drain junctions. Also as shown in FIG. 1, a first insulating layer 18, such as silicon nitride ($Si_3N_4$), is deposited on the first polysilicon layer 16. Preferably the $Si_3N_4$ can be deposited in an LPCVD reactor using, for example, dichlorosilane ($SiCl_2H_2$) and ammonia ($NH_3$) as the reactant gases. The preferred thickness of layer 18 is between about 500 and 1000 Angstroms.

Figure 2:
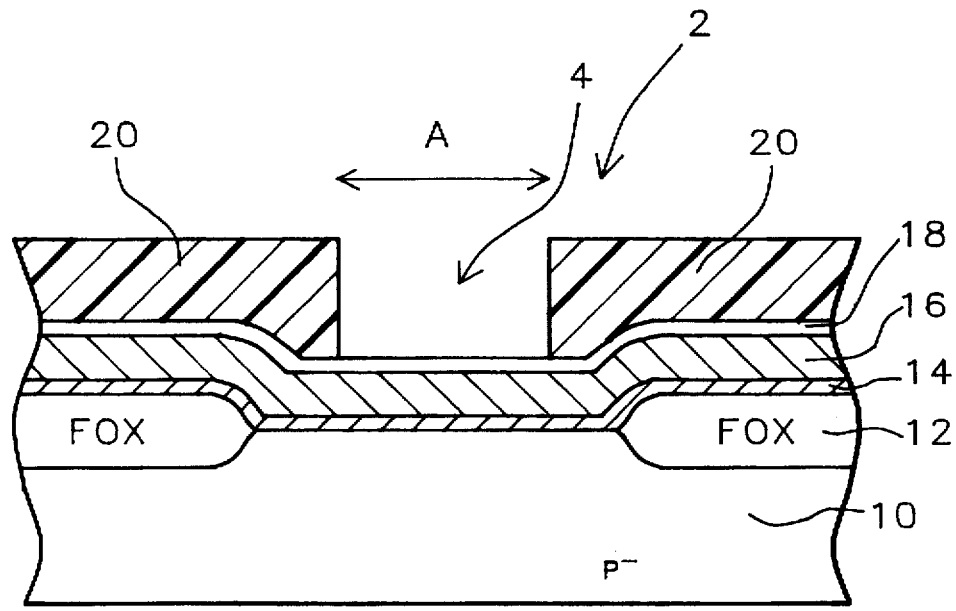

Now as shown in FIG. 2, a photoresist masking layer 20 is spin coated using conventional photolithographic techniques on the surface of the first insulating layer 18. The thickness of layer 20 is between about 8000 and 12000 Angstroms. Layer 20 is then patterned to form first openings 4 that have essentially vertical sidewalls. Openings 4 are formed over and within the device areas 2. The openings are patterned in layer 20 to define where the N-channel FET gate electrodes are required. The width A of the openings 4 is preferably the minimum dimension for the current resolution limit of the photoresist.

Figure 3:
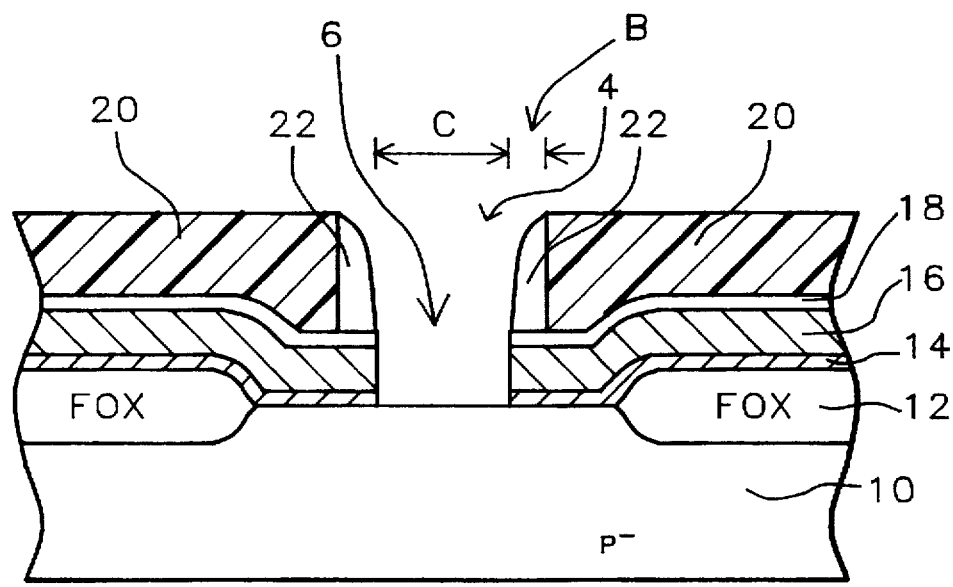
Figure 4:
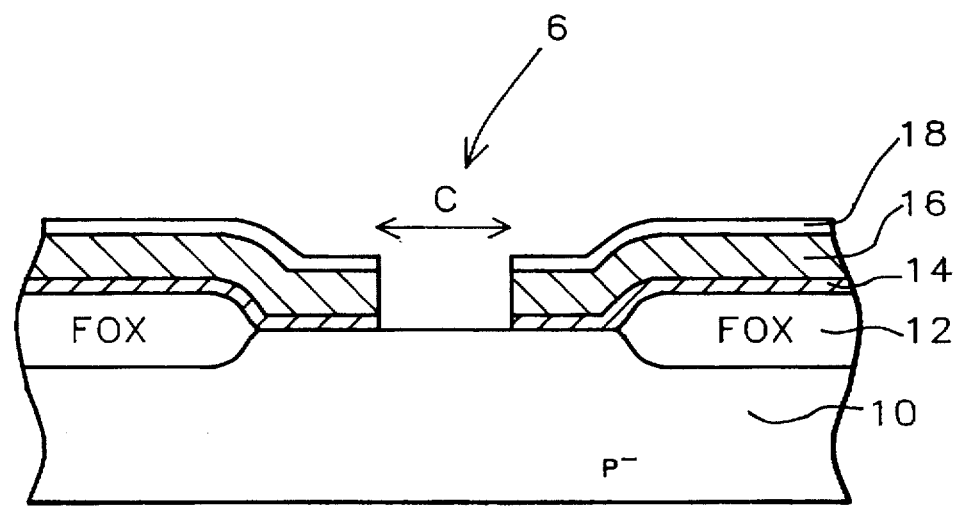

Referring to FIG. 3, and in accordance with the objects of this invention, non-volatile polymer sidewall spacers 22 are formed on the sidewalls in the first openings 4 of the photoresist layer 20. The preferred formation of the polymer sidewall spacers is carried out in a plasma etcher, such as a reactive ion etcher to form a polymer on the sidewalls of photoresist layer 20, and to simultaneously etch the polymer off the horizontal surfaces of photoresist layer 20 and the exposed $Si_3N_4$ layer 18 in the openings 4. This polymer deposition can be achieved by using a preferred gas mixture composed of argon (Ar), trifluoromethane ($CHF_3$), carbon tetrafluoride ($CF_4$), and nitrogen ($N_2$). Alternatively hydrogen bromide (HBr) can be used in place of the nitrogen gas. This polymer deposition is performed in a reactive ion etcher having a downstream/triode design, such as manufactured by Tokoyo Electronics Ltd. of Japan. The polymer is formed principally composed of hydrocarbons containing silicon and fluorine (C—H, Si, F). The preferred flow rate for the Ar is between about 450 and 550 standard cubic centimeters per minute (sccm), the flow rate of the $CHF_3$ is between about 20 and 50 sccm, the flow rate of the $CF_4$ is between about 20 and 50 sccm, and the flow rate of the $N_2$ is between about 0.0 and 10 sccm. For example, if the resulting polymer sidewall spacers 22, as shown in FIG. 3, have a width B of about 0.10 micrometer (um), then the width C of the reduced opening 6 would be 0.15 um. A key feature is that the first openings 4 with the polymer sidewall spacers 22 reduce the opening size beyond the current lithographic limits of the photoresist, as described above. The photoresist mask 20 and the sidewall spacers 22 are used as an etch mask during the anisotropic etching of the second openings 6 through the first insulating layer 18, the first polysilicon layer 16, and the metal layer 14 down to the surface of the P-doped substrate 10. These second openings 6 also have essentially vertical sidewalls in which the FET gate electrodes are now formed. As shown in FIG. 4, the polymer sidewall spacers 22 and the photoresist mask 20 are removed. Preferably the masking layers are removed using a plasma ashing in an oxygen ambient.

Figure 5:
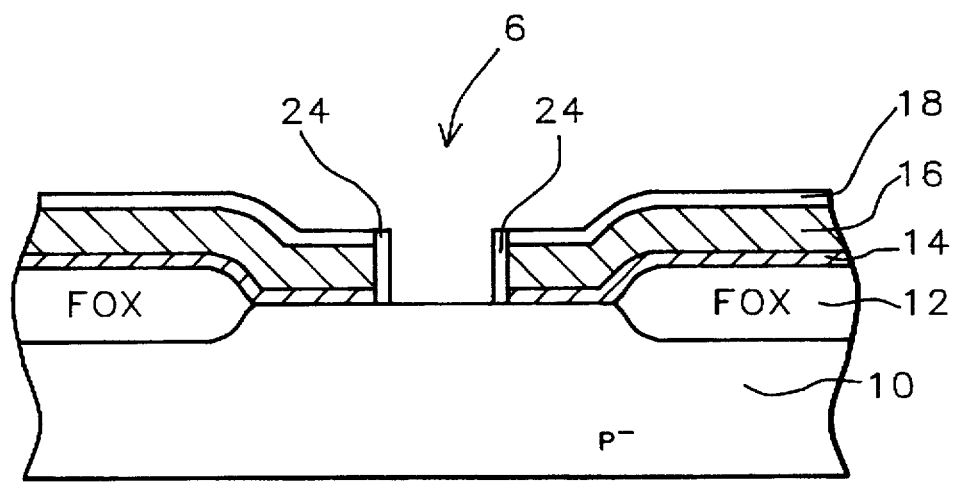

Referring now to FIG. 5, a relatively thin conformal second insulating layer 24, such as silicon oxide deposited by low pressure chemical vapor deposition (LPCVD), is deposited. For example, layer 24 can be deposited using a reactant gas such as tetraethosiloxane (TEOS). Layer 24 is typically between about 500 and 1500 Angstroms thick. Layer 24 is then anisotropically etched back resulting in sidewall spacers 24 being formed on the sidewalls of the first polysilicon layer 16, and concurrently exposing the substrate surface in the narrower second openings 6.

Figure 6:
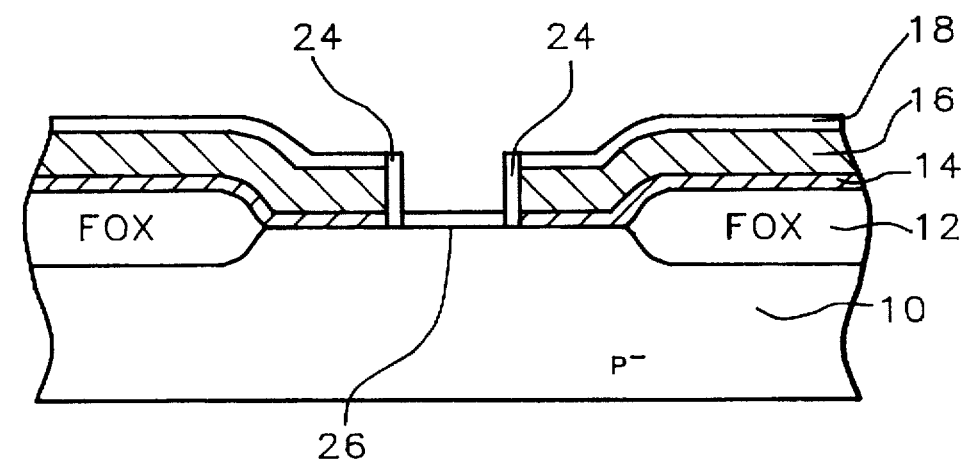

Referring to FIG. 6, a relatively thin gate oxide 26 is then grown on the exposed substrate surface in the openings 6 (channel openings) for the gate electrodes. The oxide is preferably formed by thermal oxidation in an oxidizing ambient, such as oxygen. The preferred thickness of the gate oxide 26 is between about 80 and 200 Angstroms.

Figure 7:
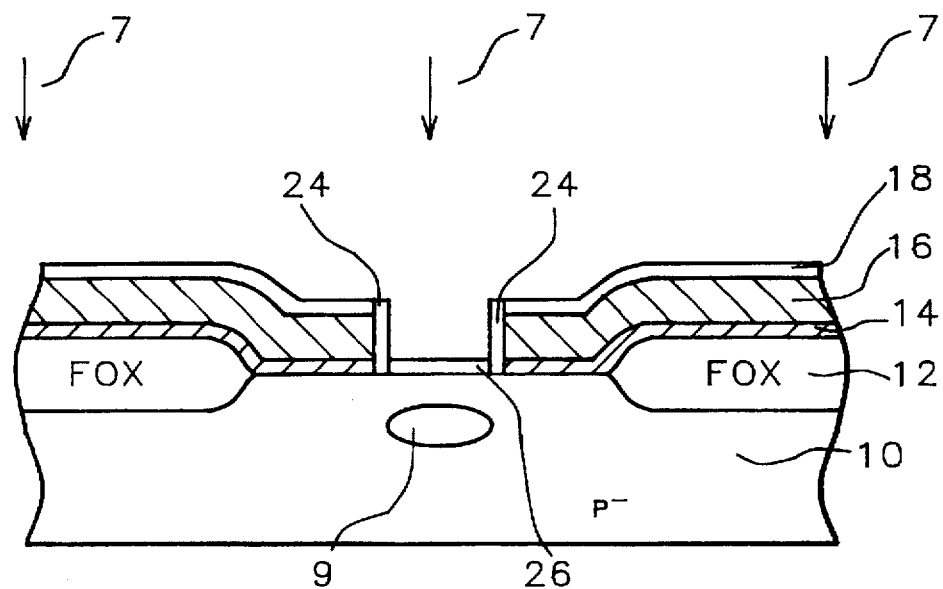

Referring now to FIG. 7, a dopant of the first conductive dopant type is implanted in the substrate 10 inside the channel openings 6 to adjust the threshold voltage ($V_{th}$) of the N-channel FET, as depicted by the vertical arrows 7. For example, boron difluoride ions ($BF_2^+$) can be used as the implant species. The implant dose and energy are determined by the device design characteristics for the specific circuit design. A second implant step is also carried out in openings 6 to form self-aligned buried anti-punchthrough regions 9 in the substrate 10, as also shown in FIG. 7. The anti-punchthrough implant is preferably carried out using an implant species of the first conductive type dopant. More specifically the dopant can be boron ($B^{11}$). This provides punchthrough immunity between the source/drain regions which are formed in subsequent processing.

Figure 8:
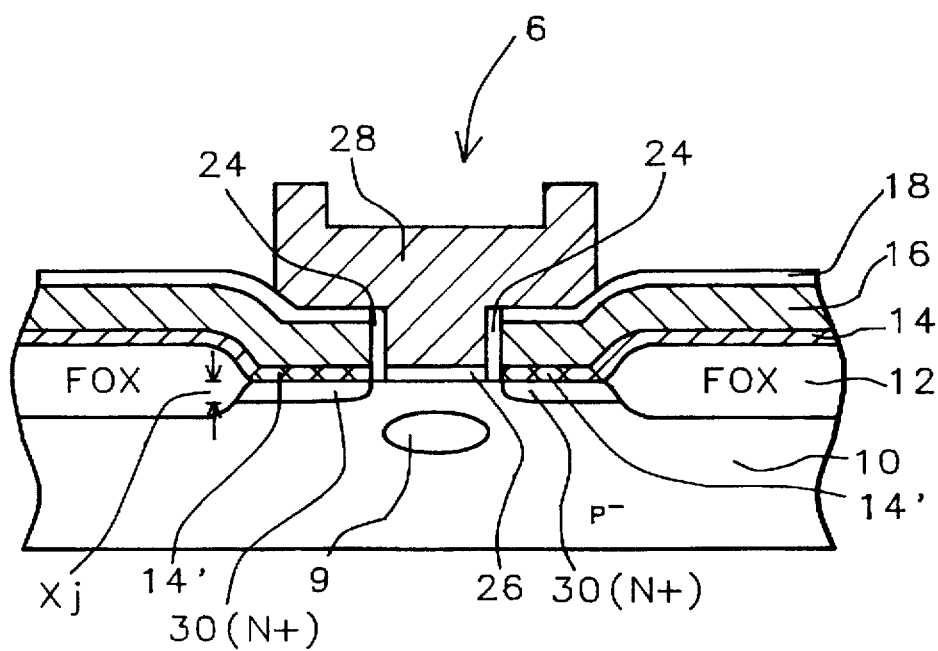

Referring to FIG. 8, a second polysilicon layer 28 is deposited by CVD using silane and is doped with the second conductive type dopant. For example, an N-type dopant such as phosphorus (P) or arsenic (As) can be used. Layer 28 can be doped by ion implantation using $p^{31}$ or $As^{75}$. Alternatively, polysilicon layer 28 can be doped in situ by adding phosphine or arsine to the silane during deposition. The preferred concentration of the dopant in layer 28 is between about 1.0 E 20 and 1.0 E 21 atoms/$cm^3$. The preferred thickness of layer 28 is between about 2000 and 3500 Angstroms. Polysilicon layer 28 is then patterned by conventional photolithographic techniques and plasma etching to form the reverse self-aligned overlapping gate electrodes, also labeled 28. Gate electrodes 28 are formed over and in channel openings 6 over the gate oxide 26.

Still referring to FIG. 8, shallow diffused junctions 30 are formed next during subsequent thermal cycling (annealing). The $N^+$ dopant in the first polysilicon layer 16 is out-diffused through the Ti layer 14 into the underlying substrate 10 to form the shallow source/drain regions 30, which are self-aligned to the sub-quarter-micrometer-wide gate electrodes 28. The heat budget (temperature and time) is preferably chosen to provide a junction depth ($X_j$) of between about 0.05 and 0.2 um below the substrate surface. Concurrently, the Ti layer 14 reacts with the first polysilicon layer 16 and the silicon substrate 10 to form low electrical resistance titanium silicide contacts 14' to the source/drain regions 30($N^+$).

While the invention has been particularly shown and described with reference to the preferred embodiment thereof, it will be understood by those skilled in the art that various changes in form and details may be made without departing from the spirit and scope of the invention. For example, by reversing the polarity of the first and second conductive type dopants and appropriately selecting the dopant concentrations, it is possible to fabricate a $P^-$ channel FET by the same invention.

What is claimed is:

1. A method for fabricating reverse self-aligned field effect transistors with shallow source/drain junctions comprising the steps of:

providing a semiconductor substrate doped with a first conductive type dopant;

forming field oxide areas on said semiconductor substrate surrounding and electrically isolating device areas;

depositing a metal layer on said substrate;

depositing a first polysilicon layer having a second conductive type dopant on said metal layer;

depositing a first insulating layer on said first polysilicon layer;

depositing a photoresist masking layer on said first insulating layer;

patterning said photoresist masking layer and thereby forming first openings having essentially vertical sidewalls in said photoresist masking layer over and within said device areas where FET gate electrodes are required;

forming polymer sidewall spacers on said vertical sidewalls in said first openings of said photoresist masking layer while exposing portions of said first insulating layer in said first openings;

anisotropically plasma etching second openings in said exposed first insulating layer, said first polysilicon layer, and said metal layer to said substrate, said second openings having essentially vertical sidewalls;

removing said polymer and said photoresist by plasma ashing;

depositing and anisotropically etching back a second insulating layer thereby forming sidewall spacers and exposing said substrate in said second openings;

forming a gate oxide on said exposed substrate;

implanting ions of said first conductive type dopant through said gate oxide into said substrate thereby forming an anti-punchthrough implant;

depositing a second polysilicon layer doped with said second conductive type dopant;

patterning said second polysilicon layer leaving portions over said second openings and thereby forming gate electrodes for said reverse self-aligned field effect transistors;

thermal annealing said substrate and diffusing through said metal layer said second conductive type dopant from said first polysilicon layer into said substrate thereby forming shallow source/drain junctions and concurrently forming metal silicide contacts, completing said reverse self-aligned field effect transistors.

2. The method of claim 1, wherein said first conductive type dopant of said substrate is a P-type conductive dopant.

3. The method of claim 1, wherein said metal layer is titanium having a thickness of between about 100 and 500 Angstroms.

4. The method of claim 1, wherein said first polysilicon layer for N-channel FETs is doped with an $N^+$ type conductive dopant.

5. The method of claim 1, wherein said first polysilicon layer has a thickness of between about 1000 and 3000 Angstroms.

6. The method of claim 1, wherein said first insulating layer is silicon nitride ($Si_3N_4$) having a thickness of between about 500 and 1000 Angstroms.

7. The method of claim 1, wherein the minimum width of said first openings in said photoresist masking layer is the limit of the resolution of said photoresist.

8. The method of claim 1, wherein said polymer sidewall spacers on said vertical sidewalls are formed on said first openings of said photoresist masking layer by simultaneously depositing and etching said polymer comprised of silicon, carbon, and hydrogen in a plasma etcher.

9. The method of claim 1, wherein said polymer sidewall spacers are formed in a plasma etcher having an etching gas mixture composed of argon (Ar), trifluoromethane ($CHF_3$), carbon tetrafluoride ($CF_4$), and nitrogen ($N_2$).

10. The method of claim 9, wherein said argon (Ar) has a flow rate of between about 450 and 550 standard cubic centimeters per minute (sccm), said trifluoromethane ($CHF_3$) has a flow rate of between about 20 and 50 sccm, said carbon tetrafluoride ($CF_4$) has a flow rate of between about 20 and 50 sccm, and said nitrogen ($N_2$) has a flow rate of between about 0 and 10 sccm.

11. The method of claim 1, wherein said second insulating layer is between about 500 and 1500 Angstroms thick.

12. The method of claim 1, wherein said anti-punchthrough implant is formed by implanting a P-type dopant.

13. The method of claim 1, wherein said second polysilicon layer is between about 2000 and 3500 Angstroms thick and is doped with an $N^+$ type conductive dopant.

14. The method of claim 1, wherein said first conductive type dopant is an N-type conductive dopant, and said second conductive type dopant is a P-type conductive dopant thereby forming P-channel FETs.

15. A method for fabricating reverse self-aligned field effect transistors with shallow source/drain junctions comprising the steps of:

providing a semiconductor substrate doped with a first conductive type dopant;

forming field oxide areas on said semiconductor substrate surrounding and electrically isolating device areas;

depositing a titanium (Ti) metal layer on said substrate;

depositing a first polysilicon layer having a second conductive type dopant on said titanium metal layer;

depositing a first insulating layer on said first polysilicon layer;

depositing a photoresist masking layer on said first insulating layer;

patterning said photoresist masking layer and thereby forming first openings having essentially vertical sidewalls in said photoresist masking layer over and within said device areas where FET gate electrodes are required;

forming polymer sidewall spacers on said vertical sidewalls in said first openings of said photoresist masking layer while exposing portions of said first insulating layer in said first openings;

anisotropically plasma etching second openings in said exposed first insulating layer, said first polysilicon layer, and said titanium metal layer to said substrate, said second openings having essentially vertical sidewalls;

removing said polymer and said photoresist by plasma ashing;

depositing and anisotropically etching back a second insulating layer thereby forming sidewall spacers and exposing said substrate in said second openings;

forming a gate oxide on said exposed substrate;

implanting ions of said first conductive type dopant through said gate oxide into said substrate thereby forming an anti-punchthrough implant;

depositing a second polysilicon layer doped with said second conductive type dopant;

patterning said second polysilicon layer leaving portions over said second openings and thereby forming gate electrodes for said reverse self-aligned field effect transistors;

thermal annealing said substrate and diffusing through said titanium metal layer said second conductive type dopant from said first polysilicon layer into said substrate thereby forming shallow source/drain junctions and concurrently forming titanium silicide contacts, completing said reverse self-aligned field effect transistors.

16. The method of claim 15, wherein said first conductive type dopant of said substrate is a P-type conductive dopant.

17. The method of claim 15, wherein said titanium metal layer has a thickness of between about 100 and 500 Angstroms.

18. The method of claim 15, wherein said first polysilicon layer for N-channel FETs is doped with an $N^+$ type conductive dopant.

19. The method of claim 15, wherein said first polysilicon layer has a thickness of between about 1000 and 3000 Angstroms.

20. The method of claim 15, wherein said first insulating layer is silicon nitride ($Si_3N_4$) having a thickness of between about 500 and 1000 Angstroms.

21. The method of claim 15, wherein the minimum width of said first openings in said photoresist masking layer is the limit of the resolution of said photo-resist.

22. The method of claim 15, wherein said polymer sidewall spacers on said vertical sidewalls are formed on said first openings of said photoresist masking layer by simultaneously depositing and etching said polymer comprised of silicon, carbon, and hydrogen in a plasma etcher.

23. The method of claim 15, wherein said polymer sidewall spacers are formed in a plasma etcher having an etching gas mixture composed of argon (Ar), trifluoromethane ($CHF_3$), carbon tetrafluoride ($CF_4$), and nitrogen ($N_2$).

24. The method of claim 23, wherein said argon (Ar) has a flow rate of between about 450 and 550 standard cubic centimeters per minute (sccm), said trifluoromethane ($CHF_3$) has a flow rate of between about 20 and 50 sccm, said carbon tetrafluoride ($CF_4$) has a flow rate of between about 20 and 50 sccm, and said nitrogen ($N_2$) has a flow rate of between about 0 and 10 sccm.

25. The method of claim 15, wherein said second insulating layer is between about 500 and 1500 Angstroms thick.

26. The method of claim 15, wherein said anti-punch-through implant is formed by implanting a P-type dopant.

27. The method of claim 15, wherein said second polysilicon layer is between about 2000 and 3500 Angstroms thick and is doped with an $N^+$ type conductive dopant.

28. The method of claim 15, wherein said first conductive type dopant is an N-type conductive dopant, and said second conductive type dopant is a P-type conductive dopant thereby forming P-channel FETs.

* * * * *